United States Patent [19]

Watring et al.

[11] Patent Number: 5,529,015

[45] Date of Patent: Jun. 25, 1996

[54] AMPOULE FAILURE SYSTEM

[75] Inventors: Dale A. Watring; Martin L. Johnson, both of Huntsville, Ala.

[73] Assignee: The United States of America as represented by the Administrator of the National Aeronautics and Space Administration, Washington, D.C.

[21] Appl. No.: 388,005

[22] Filed: Feb. 13, 1995

[51] Int. Cl.$^6$ ............................................... C30B 11/02
[52] U.S. Cl. ........................ 117/202; 117/200; 117/201; 117/223
[58] Field of Search .................................. 117/81, 82, 83, 117/200, 201, 202, 223

[56] References Cited

U.S. PATENT DOCUMENTS

| | | | |
|---|---|---|---|
| 4,627,892 | 12/1986 | Warrell et al. | 204/1 T |
| 5,112,456 | 5/1992 | Warrell et al. | 204/153.18 |
| 5,417,822 | 5/1995 | Maget | 204/153.18 |
| 5,448,905 | 9/1995 | Stetter et al. | 73/31.05 |

OTHER PUBLICATIONS

*NASA Tech Briefs*, — Dale Watring & Martin Johnson, Sensor Detects Semiconductor Escaping from Ampoule, Sep. 1994, pp. 46–48.

*NASA Tech Briefs*, Dale Watring & Martin Johnson, Sensor Detects Semiconductor Escaping From Ampoule, Nov. 1994, p. 70.

*Journal of Crystal Growth*, Ampoule failure sensor development for semiconductor crystal growth experiments, 140 (1994) 41–44, Dale Watring & Martin Johnson.

*Primary Examiner*—Robert Kunemund
*Attorney, Agent, or Firm*—Brian S. Welborn

[57] ABSTRACT

An ampoule failure system for use in material processing furnaces comprising a containment cartridge and an ampoule failure sensor. The containment cartridge contains an ampoule of toxic material therein and is positioned within a furnace for processing. An ampoule failure probe is positioned in the containment cartridge adjacent the ampoule for detecting a potential harmful release of toxic material therefrom during processing. The failure probe is spaced a predetermined distance from the ampoule and is chemically chosen so as to undergo a timely chemical reaction with the toxic material upon the harmful release thereof.

The ampoule failure system further comprises a data acquisition system which is positioned externally of the furnace and is electrically connected to the ampoule failure probe so as to form a communicating electrical circuit. The data acquisition system includes an automatic shutdown device for shutting down the furnace upon the harmful release of toxic material. It also includes a resistance measuring device for measuring the resistance of the failure probe during processing. The chemical reaction causes a step increase in resistance of the failure probe whereupon the automatic shutdown device will responsively shut down the furnace.

30 Claims, 3 Drawing Sheets

5,529,015

AMPOULE FAILURE SYSTEM

ORIGIN OF THE INVENTION

The invention described herein was made by employees of the United States Government and may be manufactured and used by or for the Government for Government purposes without the payment of any royalties thereon or therefor.

1. Field of the Invention

The present invention relates to material processing furnaces and more particularly to crystal growth furnaces which contain ampoules of toxic semiconductor material such as gallium-arsenide (GaAs), mecury-cadmium-telluride (HgCdTe) and mecury-zinc-telluride (HgZnTe). In even greater particularity, the present invention relates to a new and improved ampoule failure system used in terrestrial/microgravity crystal growth furnaces for detecting the hazardous release of toxic liquid or vapor semiconductor materials and automatically shutting down the furnace before it is contaminated.

2. Background of the Invention

An important safety issue related to materials processing is the confinement of toxic materials. For instance, crystal growth experiments utilize toxic semiconductor materials such as lead-tin-telluride (PbSnTe), mercury-zinc-telluride (HgZnTe), gallium-arsenide (GaAs) and mercury-cadmium-telluride (HgCdTe). In most crystal growth furnaces, the toxic semiconductor material is contained in a multilayer structure wherein the charge sample is first sealed in an ampoule and the ampoule is then sealed inside a metal container which is placed in the furnace. If an ampoule fails during processing, the semiconductor material will vigorously attack the thin-walled metal container. Ampoule failures in the laboratory setting have shown that a metal cartridge can be breached by molten or vaporous semiconductor material in a matter of minutes.

If the failure goes undetected, the furnace will become contaiminated with hazardous materials resulting in a terminated experiment and loss of data which can be very expensive especially in the case of microgravity experiments. Moreover, if the experiment is performed in confined areas with limited ventilation, the vapors that are released can cause permanent disability, cancer and death if inhaled. Thus, there is an added safety concern with furnaces for which the crystal grower manually changes the processed samples. The standard operating procedure is to visually inspect the cartridge before sample change out to determine if an ampoule failure has occurred. This is a time consuming and extremely hazardous if the ampoule has failed since only one-half of the cartridge is visible in the typical furnace. Therefore, it can be appreciated that there is a continuing need for and interest in improving the safety of such operating procedure, and in this respect the present invention addresses this need and interest.

SUMMARY OF THE INVENTION

In view of the foregoing disadvantages in the known types of material processing cartridges now present in the art, the present invention provides a new and improved ampoule failure system for use in material processing furnaces. As such, the principle object of the present invention, which will be described subsequently in greater detail, is to provide a new and improved ampoule failure system which has all the advantages of the prior art and none of the disadvantages.

In support of the principle object, a further object of the present invention is to provide a new and improved ampoule failure system that is capable of automatically detecting vapor or liquid semiconductor materials within cartridges used in crystal growth processing furnaces, thus eliminating the need to visually inspect the cartridge for failures.

In further support of the principal object, another object of the present invention is to provide a new and improved ampoule failure system wherein the critical measurement is the resistance of the failure sensor or probe which unambiguously indicates that an ampoule failure has occurred by a sudden change in resistance on the order of megaohms.

Another object of the present invention is to provide a new and improved ampoule failure system that will increase the safety of crystal growth experiments by providing an indication that an ampoule has failed.

Still another object of the present invention is to provide a new and improved ampoule failure system that will be most beneficial for experiments performed in confined areas with limited ventilation.

It is another object of the present invention to provide a new and improved ampoule failure system that will ultimately provide increased safety and data return by automatically shutting down crystal growth experiments when an ampoule fails, thereby preventing any release of toxic materials in a manned environment.

A further object of the present invention is to provide a new and improved ampoule failure system that can be used in any materials processing furnace.

These together with other objects of the present invention, along with the various features of novelty which characterize the invention, are accomplished through the use of an ampoule failure system which comprises a containment cartridge and an ampoule failure sensor. The containment cartridge includes an ampoule of toxic material and is operatively positioned within a furnace for processing.

The ampoule failure sensor comprises an ampoule failure probe electrically connected to a data acquisition system. The ampoule failure probe is positioned in the cartridge adjacent the ampoule for detecting a potential harmful release of the toxic material therefrom during processing. It is spaced a predetermined distance from the ampoule and is chemically chosen so as to undergo a timely chemical reaction with the toxic material upon the harmful release thereof.

The data acquisition system (i.e., computer) is positioned external of the furnace and electrically connected to the ampoule failure probe so as to form a communcating electrical circuit. The data acquisition system includes an automatic shutdown device for shutting down the furnace upon the harmful release of toxic material. The data acquisition system also includes a resistance measuring device for measuring the resistance of the failure probe during processing. The chemical reaction causes a step increase in resistance of the failure probe whereupon the automatic shutdown device will responsively shut down the furnace.

There has thus been outlined, rather broadly, the more important features of the present invention in order that the detailed description thereof that follows may be better understood, and order that the present contribution to the art may be better appreciated. There are, of course, numerous other novel features of the present invention that will become apparent from a study of the drawings and the description of the preferred embodiments and which will form the subject matter of the claims appended hereto.

Moreover, it is to be understood that the phraseology and terminology employed herein are for the purpose of description and should not be regarded as limiting. As such, those skilled in the art will appreciate that the conception, upon which this disclosure is based, may readily be utilized as a basis for the designing of other systems for carrying out the several purposes of the present invention. It is important, therefore, that the claims be regarded as including such equivalent systems insofar as they do not depart from the spirit and scope of the present invention.

BRIEF DESCRIPTION OF THE DRAWINGS

The foregoing objects and advantages of the present invention for a new and improved Ampoule Failure System will be more readily understood by one skilled in the art by referring to the following detailed description of the preferred embodiments and to the accompanying drawings which form a part of this disclosure, and wherein.

DETAILED DESCRIPTION OF THE PREFERRED EMBODIMENTS

Figures 1, 2:
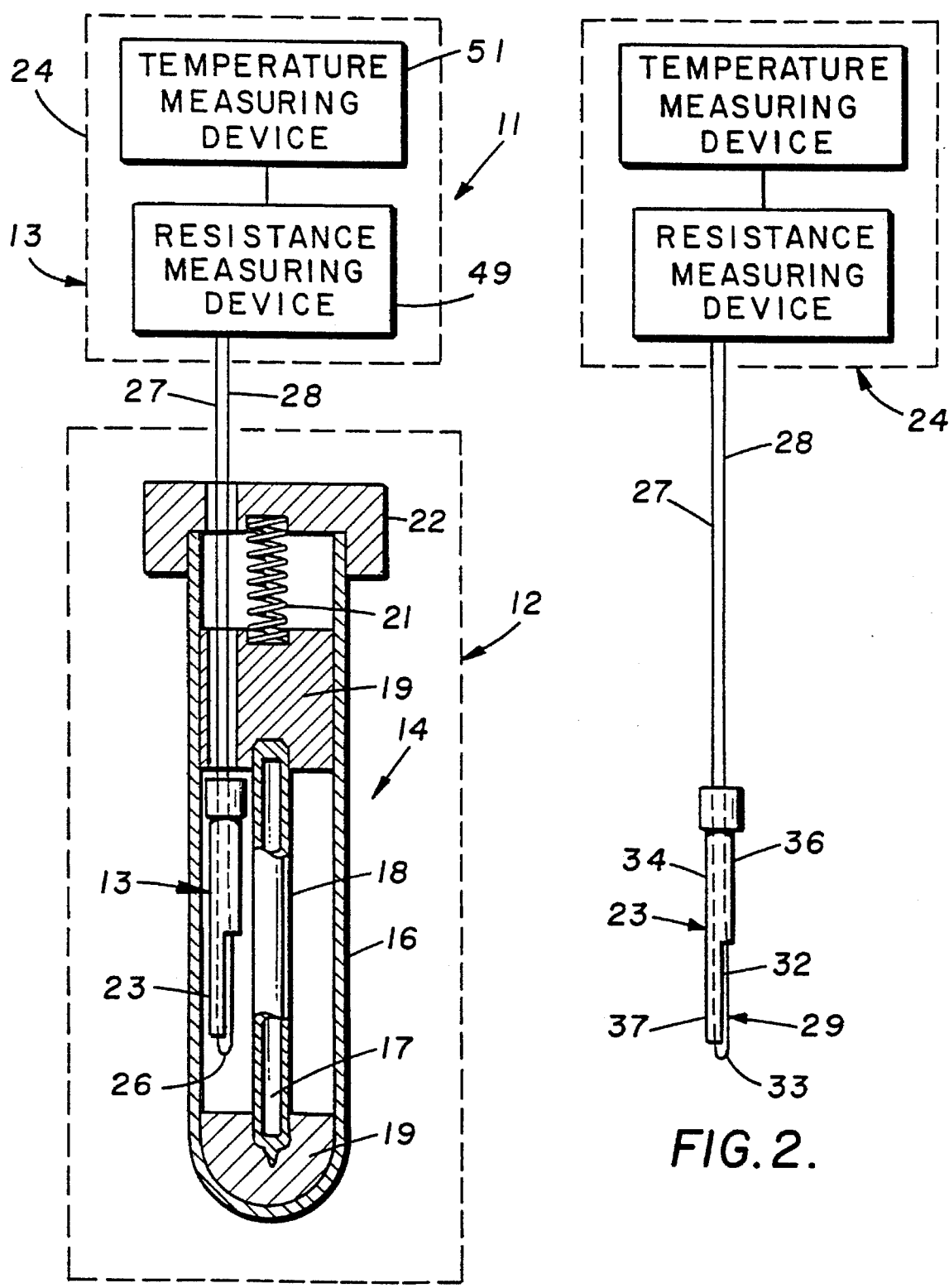
FIG. 1 is a full front-sectional view, partially in block diagram form, of an Ampoule Failure System.
FIG. 2 is a full front-sectional view, partially in block diagram form, of an ampoule failure sensor comprising an ampoule failure probe and a data acquisition system for use in the Ampoule Failure System of FIG. 1.

Referring to the drawings for clearer understanding of the present invention, FIG. 1 discloses an ampoule failure system 11 for use in a materials processing or crystal growth furnace 12 (shown in dashed lines). The ampoule failure system 11 comprises an ampoule failure sensor 13 and a containment cartridge 14. The containment cartridge 14 is placed in the furnace 12 for high-temperature processing at approximately 1238° C. It should be noted, however, that the processing temperature may consist of a variety of temperatures depending, in part, on the types of experiments performed and on the type of furnace 12 used. In this regard, while 1238° C. exemplifies the functionality of the present invention, it is to be considered representative of other possible temperatures.

The containment cartridge 14 comprises a cartridge housing 16 operatively configured so that it accommodates the furnace 12 and is typically oriented in a vertically disposed or upright position therein. Preferrably, the cartridge housing 16 is cylindrical in shape and has an outer diameter of approximately one inch, a wall thickness of approximately 0.010 to 0.030 inches, and a length of approximately nineteen to twenty-three inches. In order to withstand processing temperatures within the furnace 12 and rapid corrosion due to sample (e.g., semiconductor) leakage, the housing 16 may be constructed from a variety of known refractory metal alloys such as niobium-hafnium alloy (WC-103) (which may have an inner coating of tungsten), inconel 625, or stainless steel 304.

Alternatively, since ceramic materials are known to be generally impervious to the attack of semiconductor materials while providing high service temperatures, the housing 16 may be contructed from a variety of known ceramic materials such as pyrolytic-boron-nitride (PBN), silicon-carbide (SiC), aluminum-oxide ($Al_2O_3$), carbon (C) or any mixtures thereof.

As referred to briefly above, the containment cartridge 14 has positioned therein a confined quantity of hazardous or toxic material 17 for processing such as lead-tin-telluride (PbZnTe), gallium-arsenide (GaAs), mercury-zinc-telluride (HgZnTe) or mercury-cadmium-telluride (HgCdTe). Note that the toxic materials 17 chosen for processing are by no means limited to semiconductor materials for crystal growth experiments. The present invention may be used to detect any material, hazardous or not, in or around any type of terrestrial/microgravity material processing furnace, provided however, as will be discussed below, that the material being processed will chemically react with the failure sensor 13 if a sample leakage occurs during processing.

Referring to FIG. 1, confinement of the toxic material 17 is accomplished through the use of an ampoule 18 which is operatively secured by cartridge-specific boron-nitride ampoule supports 19 within the containment cartridge 14. Again, the present invention is not limited to the use of an ampoule 18 for confinement of the toxic material 17. Other methods may be utilized such as the Liquid Encapsulated Czockralski (LEC) method which uses a layer of material such as boric-oxide to cover or confine the toxic material 17 during processing.

The dimensions of the ampoule 18 are usually experiment specific thus vary from experiment to experiment. However, the material used to construct the ampoule 18 is typically quartz which enters the plastic flow regime at approximately 1260° C. which is higher than the processing temperature of approximately 1238° C.

In addition, the containment cartridge 14 further comprises a compression spring 21 and retaining cap 22 to further hold the ampoule 18 in place within the cartridge 14.

As shown in FIGS. 1 and 2, the ampoule failure sensor 13 is an electrochemical sensor which comprises an ampoule failure probe 23 electrically connected to a computer or data acquisition system 24 (shown in dashed lines). Generally speaking, the concerted performance of the failure probe 23 and acquisition system 24 provides the two most important functions of the present invention. First, they will detect a hazardous release of the toxic material 17 if an ampoule 18 fails during processing. Second, they will automatically shut down the furnace 12 in response to an ampoule 18 failure thus preventing contamination and personal injury.

The ampoule failure probe 23 is small enough to be placed inside the cartridge 14. It is selectively and strategically positioned within the cartridge housing 16 adjacent the ampoule 18 while the acquisition system 24 may be positioned anywhere external of the furnace 12. Note that the ampoule failure system 11 may utilize more than one failure probe 23 per ampoule 18 during processing.

In order to meet positioning requirements, the ampoule failure probe 23 comprises an electrically conductive sensing material that is selectively configured for accommodating the furnace 12 and/or the containment cartridge 14. As illustrated in FIG. 1, the sensing material may be in the form of an electrically conductive sensor metal strip (not shown) or wire 26 that is operatively extended into the cartridge housing 16 past or along side of the ampoule 18 of toxic material 17 so that it is adjacently spaced a predetermined distance therefrom of approximately 0.020 to 0.030 inches.

As referred to above, the failure probe 23 capitalizes on the chemical reaction that occurs between semiconductors and metals at the melting temperatures of the semiconductors. Thus, the material used for the sensor wire 26 is chemically chosen so that it responsively undergoes a timely high-temperature chemical reaction with the toxic material 17, which is in vapor or liquid form at processing temperatures, if the ampoule 18 fails during processing. The timely chemical reaction between the sensor wire 26 and toxic material 17 forms a eutectic metal alloy, which has a melting point much lower than the processing temperature, and is dependent on the adjacently spaced distance between the sensor wire 26 and ampoule 18. Thus, it can be seen that different types of sensor wire 26 will be required in order to undergo the chemical reaction with various types of toxic materials 17 being processed.

For instance, a platinum (Pt) sensor wire is used in conjuction with gallium-arsenide (GaAs). Assuming that an ampoule 18 has failed, the arsenic in the GaAs will evaporate at approximately 900° C. and react with the platinum in the platinum sensor wire. The result of the chemical reaction, as noted above, is the formation of a eutectic metal alloy having a melting point of approximately 610° C. which is considerably lower than the processing temperature. Likewise, a chromel or alumel sensor wire is used in conjunction with either mercury-zinc-telluride (HgZnTe) or mercury-cadmium telluride (HgCdTe). Given an ampoule 18 failure, the mercury will start to evaporate from the semiconductor material at approximately 300° C. However, the chemical reaction between the chromel or alumel sensor wire and the HgCdTe and HgZnTe occurs at approximately 700° C. and 695° C., respectively.

The chemical reaction is further dependent on the diameter of the sensor wire 26 which may be approximately 0.003 to 0.020 inches. Smaller diameter wires typically provide faster reaction times than larger diameter wires as will be discussed below.

The sensor wire 26 defines first 27 and second 28 ends which are electrically connected to the data acquisition system 24 so as to form a communicating electrical circuit therewith. In a preferred embodiment shown in FIGS. 2–4, the sensor wire 26 comprises a generally folded or U-shaped wire 29 having first 31 and second 32 extended portions connected to a folded or U-shaped portion 33. The first 31 and second 32 extended portions terminate at the first 27 and second 28 ends, respectively. Most importantly, the U-shaped portion 33 is adjacently spaced the previously referred to predetermined distance from the ampoule 18 of toxic material 17.

Figure 3:
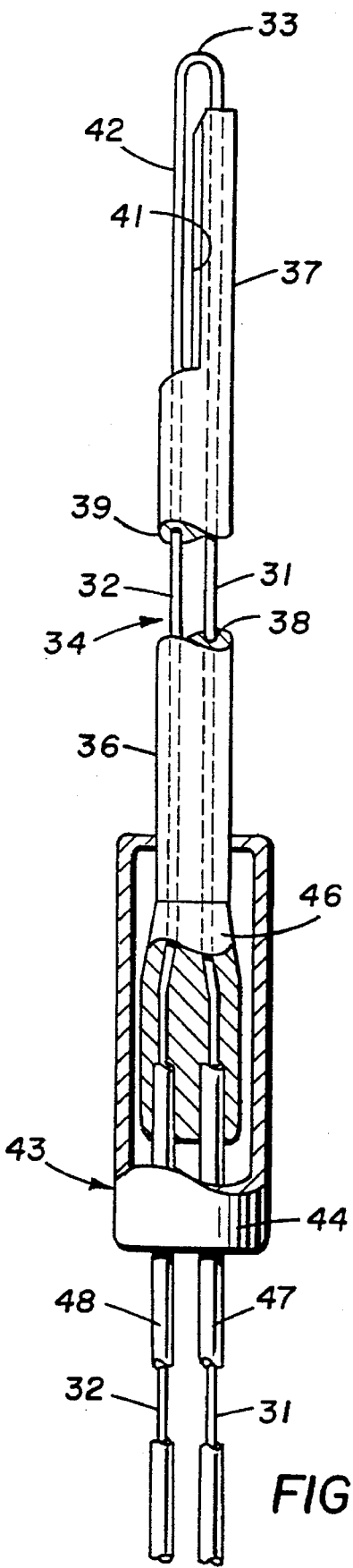
FIG. 3 is a partially broken-away front view of a preferred embodiment of an ampoule failure probe comprising an insulated housing and a generally U-shaped sensor wire.
Figure 4:
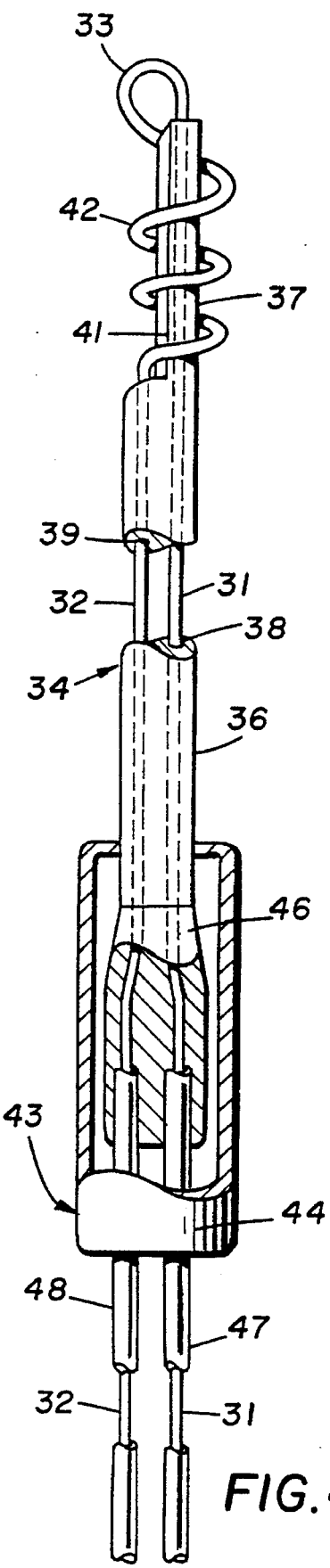
FIG. 4 is a partially broken-away front view of the ampoule failure probe of FIG. 3 having a lower segment of the generally U-shaped wire helically wrapped around a lower portion of the insulated housing.

As shown in FIGS. 3 and 4, the ampoule failure probe 23 further comprises an insulated housing 34 which is selectively adapted to be operatively received or positioned within the furnace 12 and cartridge housing 16. The primary function of the insulated housing 34 is to insulate certain selected portions of the U-shaped wire 29 during processing while exposing other portions. In this regard, the insulated housing 34 includes upper 36 and lower 37 portions which define first 38 and second 39 longitudinal holes extending therethrough for operatively receiving the first 31 and second 32 extended portions of the U-shaped wire 29 therein, respectively. For orientation purposes, once the first 31 and second 32 extended portions are positioned within the first 38 and second 39 longitudinal holes, respectively, the U-shaped portion 33 should protrude from the lower portion 37 of the insulated housing 34 so that it is exposed to the ampoule 18 of toxic material 17 during processing. This will enable the chemical reaction to primarily occur between the exposed U-shaped portion 33 and toxic material 17 upon ampoule 18 failure.

Preferrably, the insulated housing 34 is cylindrical in shape and has a diameter of approximately 0.040 to 0.125 inches. Its length is experiment specific in that it may span the entire length of the cartridge housing 16 (if necessary) in order to position the U-shaped portion 33 next to or adjacent the ampoule 18 of toxic material 17. Moreover, the material used for the insulated housing 34 is typically a ceramic such as aluminum-oxide (alumina), but can be any heat resistant insulative material.

In addition, the lower portion 37 of the insulated housing 34 further defines a machined generally flat area or flat face 41 wherein the first longitudinal hole 38 extends through both the upper 36 and lower 37 portions of the insulated housing 34 while the second longitudinal hole 39 extends only through the upper portion 36, thus further defining and exposing a lower segment 42 of the second extended portion 32 of the U-shaped wire 29 to the ampoule 18 of toxic material 17. In other words, a predetermined portion of the lower portion 37 is machined off. The only hole remaining in the lower portion 37 is the first longitudinal hole 38 which also extends through the upper portion 36. Consequently, the second longitudinal hole 39 only extends through the upper portion 36 because that portion of the lower portion 37 it originally extended through no longer exists.

As illustrated in FIG. 4, in order to provide for a faster response time of the timely chemical reaction between the U-shaped wire 29 and the toxic material 17, the lower segment 42 of the second extended portion 32 of the U-shaped wire 29 may be helically wound or wrapped around the machined off lower portion 37 of the insulated housing 34, thus maximizing the free surface area exposed to the toxic material 17.

The response time of the timely chemical reaction refers to the time it takes the toxic material 17 to degrade the U-shaped wire 29 after an ampoule 18 has failed, thus short-circuiting the electrical circuit defined above. When this occurs, a step increase in resistance of the circuit is indicated. To illustrate, when a 0.003 inch diameter helically wrapped platinum wire is used with GaAs, the response time for the chemical degradation to occur after an ampoule has ruptured is approximately 2.4 minutes. A 0.005 inch diameter wire takes approximately 3.5 minutes and a 0.010 inch diameter wire approximately 3.6 minutes. However, if a 0.005 inch non-helically wrapped wire is used, the chemical degradation occurs at approximately 5.5 minutes. Therefore, this shows why the helically wrapped wire is the optimum design.

Moreover, whether the lower segment 42 is helically wrapped or not, the flat face 41 may face or be positioned in opposing relation to the ampoule 18 for maximizing the surface area of the lower segment 42 of the U-shaped wire 29 exposed to the toxic material 17, thus further enhancing the response time of the timely chemical reaction. Positioning the flat face 41 in opposing relation to the ampoule 18 serves another function. It electrically insulates the U-shaped wire 29 from the wall of the metal cartridge housing 16. This will assist in preventing the wall of the cartridge housing 16 from short circuiting the electrical cicuit when the timely chemical reaction occurs.

The first 31 and second 32 extended portions of the U-shaped wire 29 may be constructed out of dissimilar metals in order to measure the temperature of the U-shaped portion 33 during processing by utilizing the voltage produced by the Seebeck effect. Moreover, the material used for the extended portion that is exposed to the ampoule 18 of toxic material 17 should be in its purest form to allow the most efficient chemical reaction to occur. For example, the second extended portion 32 should be pure platinum while the first extended portion 31 may be platinum plus approximately 10–30% Rhodium (which acts as a stiffener). In this scenario, the U-shaped portion 33 may be viewed as the "hot junction" and the data acquisition system 24 the "cold junction".

Figure 5:
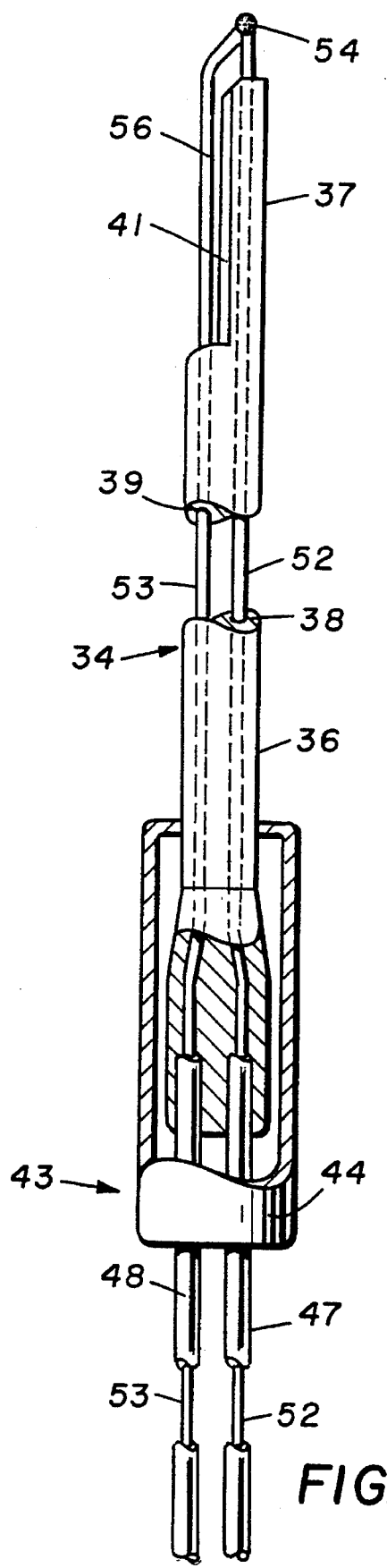
FIG. 5 is a partially broken-away front view of another preferred embodiment of an ampoule failure probe comprising an insulated housing and first and second sensor wires connected at a junction.
Figure 6:
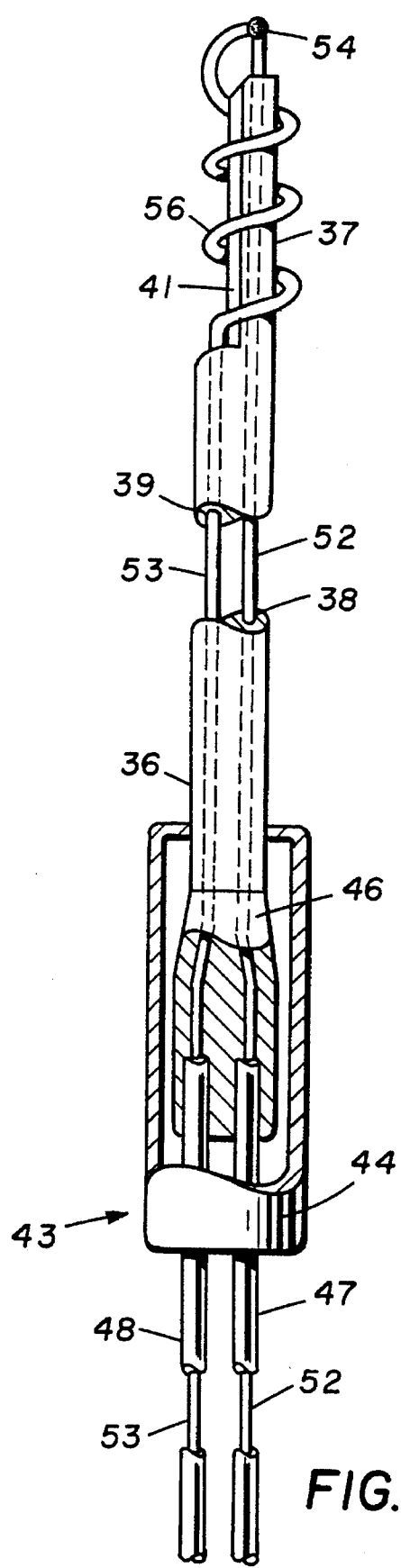
FIG. 6 is a partially broken-away front view of the ampoule failure probe of FIG. 5 having a lower segment of the second sensor wire helically wound around a lower portion of the insulated housing.

In an alternative embodiment shown in FIGS. 5 and 6, the sensor wire 26 may be comprised of first 52 and second 53 wires connected together at one end to form a junction 54. In this embodiment, the requirements of the first 52 and second 53 wires and the junction 54 correspond to the requirements of the first 31 and second 32 extended portions and the U-shaped portion 29 of the previous embodiment of FIGS. 3 and 4, respectively. The only difference is structural in that sensor wire 26 of FIGS. 5 and 6 is constructed out of two separate wires as opposed to only one. All other functional requirements are the same. For instance, the first 52 and second 53 wires may be constructed out of dissimilar metals and a segment 56 of the second wire 53 may be helically wrapped around the lower portion 37 of the insulated housing 34.

Referring to FIGS. 3–6, the ampoule failure probe 23 may include a transition assembly 43 comprising an insulated protective covering 44 and standard potting material 46. The transition assembly 43 assists in the electrical connection of the ampoule failure probe 23 to the data acquisition system 24. The transition assembly 43 further comprises first 47 and second 48 teflon insulated connector portions. These portions provide insulation protection to the first 31 and second 32 extended portions of the U-shaped wire 29 in FIGS. 3 and 4 and to the first 52 and second 53 wires in FIGS. 5 and 6 in addition to that provided by the insulated housing 34. Once the respective wires exit the upper portion 36 of the insulated housing 34, they are protected with teflon insulation until they terminate at the first 27 and second 28 ends, respectively, at which time they are connected to the data acquisition system 24. Note that the wire protected by the first 47 and second 48 teflon insulated portions does not necessarily have to consist of the same metal as that of the sensor wire 26. The only requirement is electrical conductivity.

As illustrated in FIGS. 1 and 2, the data acquisition system 24, which is electrically connected to the ampoule failure probe 23, comprises a resistance 49 and temperature 51 measuring device and a furnace shutdown device (not shown). Note that the furnace shutdown device 51 may, instead, be part of the furnace 12 itself.

In operation, the electrical connection between the data acquisition system 24 and the sensor wire 26 forms a communicating electrical circuit. The resistance and temperature measuring device 49 takes alternating temperature and resistance measurements of the sensor wire 26 at a frequency of approximately one hertz throughout processing. If an ampoule 18 fails during processing releasing toxic material 17, the timely chemical reaction will cause a break in the electrical circuit by chemically altering the sensor wire 26 (i.e., forming a eutectic metal alloy) thereby increasing the resistance of the sensor wire 26 (i.e., of the circuit) whereupon the furnace shutdown device 51 will automatically and responsively shut down the furnace 12 to prevent contamination and personal injury. This step increase in resistance is on the order of megaohms.

The following example demonstrates that an ampoule failure system 11 is capable of detecting vapor or liquid semiconductor materials within processing furnaces. The critical measurement is the resistance of the ampoule failure sensor wire which unambiguously indicates that an ampoule failure has occurred with a sudden change on the order of megaohms.

The system takes advantage of the high-temperature chemical reaction between the semiconductor material and the sensor metal. The test sensor consists of two dissimilar metals which form a closed electrical circuit. Upon ampoule failure, the sensor is immediately exposed to the molten semiconductor material and the chemical reaction causes a resistance change. The resistance is monitored to detect an ampoule failure. By using two dissimilar sensor metals, one can measure the temperature by utilizing the Seebeck effect. Note that there is no limitation to standard thermocouple wire materials for the sensor. A bare wire, single element, may be used without temperature measurements as long as the wire will react with the vapor or liquid semiconductor material.

The test sensor comprises a two holed alumina tube with a machined flat area in which only on hole remains. The sensor wire is wrapped around this area maximizing the free surface area available for chemical reaction. The machined area also provides a larger gap between the two wires when the sensor fails. This larger gap prevents the molten semiconductor from reforming the electrical circuit once a failure has occurred.

A chromel-alumel wire was chosen for HgCdTe and HgZnTe. A platinum-rhodium wire combination was chosen based on the chemical reactions of platinum and arsenic at elevated temperatures which forms a low melting point eutectic. Since the diameter of the wire has primary influence on the reaction time, a 0.003 inch diameter wire was chosen for all testing. The wires are welded together and the failure sensor is connected to a data acquisition system using appropriate extension wire.

A standard cartridge for semiconductor processing was used. A quartz liner with the same free volume as the cartridge was used in lieu of a metallic cartridge due to cost and time considerations. The semiconductor material was placed between the boron-nitride ampoule supports which represents the scenario in which the ampoule is ruptured prior to processing. The ampoule failure sensor is then inserted into a groove in the boron-nitride into the area where the semiconductor is located. The assembly is then placed in a Bridgman-Stockbarger furnace in which the temperature was increased to simulate crystal growth furnace transient power up. The temperature and resistance of the sensor were recorded until the sensor showed that the ampoule had failed as indicated by a step change in both measured quantities.

Approximately 20 g of HgCdTe were used in the test. The results indicate both resistance and temperature of the sensor versus time. The temperature and resistance initially increased as expected. However, at an elapsed time of 108 minutes, the resistance shows a step change of the order of megaohms. This step change in resistance clearly indicates that the sensor is degraded, indicating an ampoule failure. At the same time, the temperature measured by the failure sensor shows apparent temperature fluctuations on the order of 1000's of degrees centigrade. These temperature fluctuations have the typical signature observed of a thermocouple failure due to other causes such as signal processing errors, twisted leads, grounded bead, electromagnetic interference, and/or stray voltages. Therefore, one cannot detect an ampoule failure based on the indicated temperature of a thermocouple alone, but this test reveals that the key failure indication is resistance change of the order of megaohms.

The platinum-rhodium sensor is tested with 40 g of GaAs. The resistance of the sensor experiences a step change in resistance of the order of megaohms. The change in resistance occurred at a temperature of 900° C. which is 338° C. below the melting point of GaAs, thus clearly showing that the arsenic evolving from the GaAs solid reacts with the sensor.

The final test is conducted on a sealed ampoule which contains approximately 1 g of HgZnTe. In order to determine if failure would occur during heat up or cool down, the sensor was placed beside the ampoule in the processing furnace. The ampoule ruptured after 395 minutes of processing as indicated by a sudden 20° C. temperature change. The sensor did not unambiguously show ampoule failure until 100 minutes later when a megaohm change in resistance was observed. In any case, the ampoule was ruptured during heat up. Most importantly, these tests indicate that the ampoule failure sensor is capable of detecting small amounts of a semiconductor material in a relatively large free volume.

While the present invention has been described in considerable detail with reference to certain preferred versions thereof, other versions are possible. For example, the ampoule failure sensor 13 may be used with the Liquid Encapsulated Czochralski growth method of semiconductor materials. This process involves melting a semiconductor material in a containing boat and then lowering a seed into the melt and "pulling the crystal". The melted semiconductor material must be covered with boric oxide to prevent the evaporation of the toxic elements such as arsenic. If the boric oxide layer is penetrated, the arsenic will evaporate causing a potential health hazard. The ampoule failure sensor 13 would enable one to know if this scenario has happened.

Moreover, the ampoule failure sensor 13 could be used in smelting operations or material purification processes where the toxic materials are separated from impurities at elevated temperatures. In addition, the ampoule failure sensor 13 could be used in processes today which utilize mercury (Hg) heat pipes to provide precise temperature profiles. These heat pipes are prone to failure which results in releasing vaporous mercury in a manned environment. The ampoule failure sensor 13 would be useful to notify personnel that a failure has occurred.

Therefore, the spirit and scope of the appended claims should not be limited to the description of the preferred versions contained herein.

Having set forth the nature of the present invention, what is claimed is:

1. An ampoule failure probe for use in a crystal growth furnace, comprising:
   (a) first and second metal wires connected together at one end forming a junction; and
   (b) an insulated housing having upper and lower portions with first and second longitudinal holes extending therethrough for receiving said first and second wires therein, respectively, said junction protruding out of said lower portion of said insulated housing.
2. An ampoule failure probe as defined in claim 1 wherein said lower portion of said insulated housing further defines a generally flat area with said first hole extending through both said upper and lower portions of said insulated housing and said second hole extending only through said upper portion thus further exposing a lower segment of said second wire.
3. An ampoule failure probe as defined in claim 2 wherein said lower segment of said second wire is helically wrapped around said lower portion of said insulated housing.
4. An ampoule failure probe as defined in claim 2 wherein said first and second wires are dissimilar metals.
5. An ampoule failure sensor for detecting the harmful release of hazardous materials within a materials processing furnace, said furnace including a confined quantity of hazardous material for processing and an automatic shutdown device for automatically shutting down said furnace upon said harmful release of hazardous material, said sensor comprising:
   (a) an electrically conductive sensing material operatively configured for accommodating said processing furnace and selectively adapted for chemically reacting with said hazardous material, said sensing material proximately spaced a distance from said confined quantity of hazardous material such that said sensing material will undergo a timely chemical reaction with said hazardous material upon said harmful release thereof, said timely chemical reaction dependent on said distance; and
   (b) resistance measuring means electrically connected to said sensing material so as to form an electrical circuit, said chemical reaction causing a break in said electrical circuit by chemically altering said sensing material thereby increasing the resistance of said electrical circuit whereupon said shutdown device will responsively shut down said processing furnace.
6. An ampoule failure sensor as defined in claim 5 wherein said electrically conductive sensing material comprises an electrically conductive sensing wire extending past said confined quantity of hazardous material at said distance therefrom, said sensing wire having first and second ends electrically connected to said resistance measuring means for forming said electrical circuit.
7. An ampoule failure sensor as defined in claim 6 wherein said sensing wire comprises a generally U-shaped wire having a preselected diameter and first and second extended portions connected to a U-shaped portion, said first and second extended portions terminating at said first and second ends, respectively, said U-shaped portion adjacently spaced said distance from said confined quantity of hazardous material, said timely chemical reaction further dependent on said diameter of said U-shaped wire.
8. An ampoule failure sensor as defined in claim 7 wherein said first and second extended portions are insulated.
9. An ampoule failure sensor as defined in claim 7 wherein said sensor further comprises an insulated housing selectively adapted to accommodate said processing furnace, said insulated housing having upper and lower portions with first and second longitudinal holes extending therethrough for operatively receiving said first and second extended portions of said U-shaped wire therein, respectively, said U-shape portion protruding from said lower portion of said insulated housing so that it is exposed to said confined quantity of hazardous material.
10. An ampoule failure sensor as defined in claim 9 wherein said lower portion of said insulated housing further defines a flat face, said first longitudinal hole extending through both said upper and lower portions of said insulated housing, said second longitudinal hole extending only through said upper portion of said insulated housing thus further exposing a lower segment of said second extended portion of said U-shaped wire to said confined quantity of hazardous material.

11. An ampoule failure sensor as defined in claim 10 wherein said lower segment of said second extended portion of said U-shaped wire is helically wrapped around said lower portion of said insulated housing for minimizing the reaction time of said timely chemical reaction by exposing the maximum amount of surface area of said helically wrapped lower segment to said hazardous material upon said harmful release thereof.

12. An ampoule failure sensor as defined in claim 10 wherein said flat face of said lower portion is positioned in opposing relation to said confined quantity of hazardous material for exposing the maximum amount of surface area of said U-shaped wire to said hazardous material upon said harmful release thereof.

13. An ampoule failure sensor as defined in claims 11 or 12 wherein said first and second extended portions of said U-shaped wire are dissimilar metals, said resistance measuring means including temperature measuring means for measuring the temperature of said U-shaped portion during said processing.

14. An ampoule failure sensor for use in a materials processing furnace, said furnace including an ampoule of toxic material for high-temperature processing and automatic shutdown means for shutting down said furnace, said sensor comprising:

(a) a sensor metal chemically responsive to said toxic material, said sensor metal operatively extended into said furnace and adjacently spaced a distance from said ampoule of toxic material so as to undergo a timely chemical reaction with said toxic material if said ampoule fails during processing, said chemical reaction chemically altering said sensor metal so as to form a eutectic metal; and (b) data acquisition means electrically connected to said sensor metal so as to form an electrical circuit for communicating with said sensor metal, said data acquisition means including resistance measuring means for measuring the resistance of said sensor metal during said processing, said chemical reaction causing a step resistance change in said sensor metal, said resistance measuring means connected to said automatic shutdown means, said shutdown means responsive to said step resistance change.

15. An ampoule failure sensor as disclosed in claim 14 wherein said sensor metal comprises a metal wire extending past said ampoule of toxic material said distance therefrom, said wire having first and second ends electrically connected to said resistance measuring means for forming said electrical circuit.

16. An ampoule failure sensor as disclosed in claim 15 wherein said metal wire comprises a folded metal wire having first and second extended portions connected to a folded portion, said first and second extended portions terminating at said first and seconds ends, respectively, said folded portion positioned said distance from said ampoule of toxic material.

17. An ampoule failure sensor as disclosed in claim 16 wherein said first and second extended portions are insulated.

18. An ampoule failure sensor as disclosed in claim 16 wherein said failure sensor further comprises an insulated housing operatively received within said processing furnace, said housing having upper and lower portions with first and second longitudinal holes extending therethrough for operatively receiving said first and second extended portions therein, respectively, said folded portion extending out of said lower portion so that it is exposed to said ampoule of toxic material during said processing.

19. An ampoule failure sensor as disclosed in claim 18 wherein said lower portion of said insulated housing further includes a generally flat area, said first longitudinal hole extending through both said upper and lower portions, said second longitudinal hole extending only through said upper portion thus further exposing a lower segment of said second extended portion of said folded metal wire to said ampoule of toxic material during said processing.

20. An ampoule failure sensor as disclosed in claim 19 wherein said lower segment of said second extended portion is wrapped around said generally flat area of said lower portion of said insulated housing.

21. An ampoule failure sensor as disclosed in claim 19 wherein said generally flat area of said lower portion of said insulated housing is positioned in opposing relation to said ampoule of toxic material.

22. An ampoule failure sensor as disclosed in claim 19 wherein said first and second extended portions are dissimilar metals, said resistance measuring means including temperature measuring means for measuring the temperature of said folded portion.

23. An ampoule failure system for use in a crystal growth furnace, said furnace including automatic shutdown means for automatically shutting down said furnace, said ampoule failure system comprising:

(a) a containment cartridge operatively positioned within said furnace;

(b) an ampoule containing a toxic material operatively positioned within said cartridge for processing;

(c) an ampoule failure probe positioned in said cartridge adjacent said ampoule for detecting a potential harmful release of said toxic material therefrom during said processing, said failure probe spaced a distance from said ampoule and chemically chosen so as to undergo a timely chemical reaction with said toxic material upon said harmful release thereof; and (d) data acquisition means positioned external said furnace and electrically connected to said ampoule failure probe so as to form an electrical circuit, said data acquisition means including resistance measuring means for measuring the resistance of said probe during said processing, said chemical reaction causing a step resistance increase in said probe, said resistance measuring means connected to said shutdown means, said shutdown means responsive to said resistance increase.

24. An ampoule failure system as defined in claim 23 wherein said failure probe comprises first and second metal wires connected together at one end forming a junction, said junction spaced said distance from said ampoule, said wires each electrically connected at an end distal said junction to said resistance measuring means for forming said electrical circuit.

25. An ampoule failure system as defined in claim 24 wherein said failure probe further comprises an insulated housing operatively received within said cartridge, said insulated housing having upper and lower portions with first and second holes extending therethrough for operatively receiving said first and second wires therein, respectively, said junction protruding out of said lower portion of said insulated housing so that it is exposed to said ampoule during said processing.

26. An ampoule failure system as defined in claim 25 wherein said lower portion of said insulated housing further defines a generally flat area, said first hole extending through both said upper and lower portions of said insulated housing, said second hole extending only through said upper portion of said insulated housing thus further exposing a lower segment of said second wire to said ampoule during said processing.

27. An ampoule failure system as defined in claim 26 wherein said lower segment of said second wire is wound around said lower portion of said insulated housing.

28. An ampoule failure system as defined in claim 26 wherein said generally flat area of said lower portion is positioned in said cartridge so that it faces said ampoule during said processing.

29. An ampoule failure system as defined in claims 27 or 28 wherein said first and second wires are dissimilar metals, said resistance measuring means including temperature measuring means for measuring the temperature of said junction during said processing.

30. An ampoule failure system as defined in claim 25 wherein said failure system comprises at least two ampoule failure probes.

* * * * *